United States Patent [19]
Credle et al.

[11] Patent Number: 5,454,927
[45] Date of Patent: Oct. 3, 1995

[54] CERAMIC SUBSTRATES WITH HIGHLY CONDUCTIVE METAL VIAS

[75] Inventors: Kenneth Credle, Highland Park; Christopher G. Wolf, Beach Park; John McConnell, Zion, all of Ill.

[73] Assignee: Cirqon Technologies Corporation, Gurnee, Ill.

[21] Appl. No.: 294,263

[22] Filed: Aug. 23, 1994

Related U.S. Application Data

[62] Division of Ser. No. 902,082, Jun. 22, 1992, Pat. No. 5,340,947.
[51] Int. Cl.$^6$ .................................. C25D 5/02; C25D 5/50
[52] U.S. Cl. ............................... 205/123; 205/224
[58] Field of Search ........................ 205/123, 125, 205/161, 163, 224, 920, 126; 427/97

[56] References Cited

U.S. PATENT DOCUMENTS 4,131,516  12/1978  Bakos ........................... 29/832
4,681,656   7/1987  Byrum .......................... 156/645
4,715,117  12/1987  Enomoto ........................ 29/851
5,252,195  10/1993  Kobayashi ..................... 205/126

Primary Examiner—John Niebling
Assistant Examiner—Brendan Mee
Attorney, Agent, or Firm—Olson & Hierl, Ltd.

[57] ABSTRACT

A ceramic substrate is provided with filled via holes for electrical or thermal feedthrough to or from an electronic device, each via hole having at least one dimension from about 4 to about 50 mils. The via holes are filled with copper, silver or gold for high conductivity and the filling is without visible voids at a magnification of 1000 diameters. The filling is preferably hermetic and is achieved by first electrodepositing metal into the holes and extending therefrom as dumbbell shaped plugs and then heating the substrate to the melting point of the metal so that metal from the dumbbell ends enters the connecting portion within the via hole to seal any aperture therein.

9 Claims, 2 Drawing Sheets

CERAMIC SUBSTRATES WITH HIGHLY CONDUCTIVE METAL VIAS

This application is a division of application Ser. No. 07/902,082, filed Jun. 22, 1992 now U.S. Pat. No. 5,340,947.

BACKGROUND OF THE INVENTION

This invention relates to a ceramic substrate for a packaged electronic device and particularly to via holes through the substrate filled with a highly conductive metal to provide electrical and/or thermal feedthrough to or from the device. Most particularly it relates to a ceramic substrate with filled via holes which provide hermetic sealing to a packaged electronic device.

For some purposes, it is essential that electronic devices employing microcircuitry utilize conducting paths as short as possible to minimize inductance losses in the circuitry. It is also essential that the conducting paths be highly conductive to minimize resistance losses and consequent heat generation.

It is also essential for some purposes, particularly involving relatively high amperage and prolonged continuous use, that heat be transferred away from the electronic devices in a quick and effective manner.

Finally, it is also essential for some purposes, that the aforementioned necessary electrical and/or thermal conductivities be obtained without the sacrifice of hermetic sealing in the package because moisture and other constituents of ambient air can be detrimental to sensitive microcircuitry and because some devices are intended to operate in even more hostile environments.

To deal with these problems, the prior art has gone to via holes in ceramic substrates, filled with a conductive metal.

U.S. Pat. No. 4,942,076, granted Jul. 17, 1990 to Ramachandra M. P. Panicker et al. discloses a method for making metal filled via holes in a ceramic substrate by squeegeeing a tungsten paste containing a binder into the via holes in the substrate, sintering to burn off the paste binder to leave a porous tungsten mass in each via hole, squeegeeing a copper paste on the top of the sintered tungsten in the via holes and reflowing the copper in the paste into the pores of the sintered tungsten. It is disclosed that the amount of binder in the tungsten paste (and thereby the amount of porosity of the sintered tungsten) can be adjusted so that the thermal coefficient of expansion of the tungsten/copper composite matches that of the ceramic substrate to provide stability against separation with temperature changes.

U.S. Pat. No. 4,861,641, granted Aug. 29, 1989 to Brian C. Foster et al. discloses a method for making a fired ceramic substrate with metallized vias by punching via holes in a green tape, filling the punched holes with a tungsten ink and then firing the green tape with its filled via holes. To obtain hermeticity, the co-fired tungsten-filled vias are then further treated by depositing another metal thereon by brush coating and heating or by electroless deposition; and this further treatment is repeated, as necessary, until hermeticity is achieved.

U.S. Pat. No. 4,732,780, granted Mar. 22, 1988 to Stephan P. Mitoff et al. discloses producing a hermetic feedthrough in a ceramic substrate by providing a sheet of liquid phase sinterable ceramic composition having a feedthrough hole, filling the hole with refractory metal metallization material, firing the resulting structure to produce a sintered substrate with adherent metallization comprising refractory metal and glass and then contacting the refractory metal with an electrically conductive intrusion metal and heating the resulting structure so that the intrusion metal melts and displaces the glass.

U.S. Pat. No. 4,131,516, granted Dec. 26, 1978 to Peter Bakos et al. discloses a ceramic substrate with via holes which are first primed with a palladium coating on the inside surfaces of the holes, then coated with an iron film onto the palladium and finally filled with copper flowed into the holes by melting. The iron film is disclosed as essential in order to achieve good adhesion between the copper and the palladium.

U.S. Pat. No. 5,113,315, granted May 12, 1992 to Michael L. Capp, et al. discloses, inter alia, via holes filled with copper for the purpose of thermal conductivity to pass generated heat to heat sink structures. The copper in the via holes, deposited initially by electroless coating and thereafter by electrodeposition is shown in the drawings as completely filling the via holes; and grossly it does fill the holes. However, the filling is not complete because, inherently, complete filling of a hole cannot be obtained by electrodeposition. In electrodeposition, metal can be deposited onto a cathode only as long as the cathode surface is available to the electrolyte solution. Once the hole is almost closed and the flow of electrolyte solution is substantially blocked, electrodeposition cannot continue and the hole remains less than totally filled.

U.S. Pat. No. 5,100,714, granted Mar. 31, 1992 to Kalman F. Zsamboky discloses the metallizing of a ceramic substrate, which may contain via holes, by electroless coating followed by electrodeposition and finally by a heating step to a temperature just below the melting temperature of the electrodeposited metal, specifically at the melting point of the eutectic composition of the metal and its oxide. In the case of electrodeposited copper, which melts at 1085.4° C., the heating step is carried out at a temperature between about 1066° C. and 1075° C. At this temperature, the copper within the via hole does not melt and the hole remaining after electrodeposition is not filled.

Those of the foregoing patents which deal with hermetic sealing achieve their results by complex and expensive procedures and, in some cases, with composite filler materials which have poorer electrical and thermal conductivities than copper, silver, gold or alloys thereof.

SUMMARY OF THE INVENTION

In accordance with one aspect of the present invention there is produced a substrate for providing electrical or thermal feedthrough to or from an electronic device in a package comprising a thin ceramic plate having a plurality of via holes therethrough, each of said via holes having at least one transverse dimension measuring from about 3 mils to about 50 mils, each of said via holes being completely filled with a metal selected from the group consisting of copper, silver, gold and alloys thereof, said filling being in the form of a dumbbell-shaped plug of said metal, said dumbbell shape comprising a narrow, connecting center portion filling said hole and said two wider end portions extending beyond the ends of said via hole.

The ceramic plate may comprise any ceramic material which is strong, thermally stable and a good insulator. Aluminum oxide is most commonly used because of its excellent qualities and low cost. Where improved thermal conductivity is desired, beryllium oxide or aluminum nitride may be used.

Copper is generally the preferred metal filler for the via holes by reason of its excellent electrical and thermal conductivity and low cost. For convenience, the invention will be described hereinafter, primarily in terms of its preferred embodiment, namely, embodying an aluminum oxide substrate with metallic copper as the filler in the via holes.

In another embodiment, there is produced a substrate for providing electrical or thermal feedthrough to or from an electronic device in a package comprised of this ceramic plate having a plurality of via holes therethrough, each of said via holes having at least one transverse dimension measuring from about 3 mils to about 50 mils, each of said via holes being completely filled with a metal selected from the group consisting of copper, silver, gold and alloys thereof, said filling providing hermetic sealing to said package so that helium gas at ambient temperature and at a pressure differential of one atmosphere does not pass therethrough into the package at a rate as high as $1 \times 10^{-9}$ cc/sec. after the substrate has been subjected to 250 heat/cool cycles between $-50°$ C. and $150°$ C.

In still another embodiment, the invention embodies a process of providing electrical or thermal feedthrough to or from a thin ceramic plate which comprises producing in said plate a plurality of via holes, each having at least one transverse dimension from about 3 mils to about 50 mils, applying to the entire surface of said substrate a thin coating of a conductive metal, applying a resist coating to each of the major surfaces of said plate except at a small area around each entry of each via hole, electrodepositing a conductive metal of the group consisting of copper, silver, gold and alloys thereof onto said plate to the extent that each of said via holes is partially, but not completely filled with said metal and to the extent there is a deposit of said metal in each of said small areas which is sufficiently thick to fill at least about 5 percent of the volume of said via hole, and preferably at least about 50 percent, removing said resist coating and said thin conductive metal coating where it is exposed and thereafter heating said ceramic plate to a temperature at least as high as the melting point of said electrodeposited metal whereby metal from at least one of said small areas at each entry of each via hole is drawn into said via hole to complete the filling thereof.

When the amount of electrodeposited metal in each via hole is relatively small (i.e. approaching about 5 volume percent), the small area around each via hole must be correspondingly larger so that there is enough electrodeposited metal at each end to fill the remainder of the hole after melting.

The via holes in the ceramic plate may be produced therein either when the ceramic material is in the "green" sheet form (i.e., before it is fired), or in its final, hardened solid form (after firing).

When holes are punched into the ceramic in the green sheet, their placement in the final fired sheet may not be as precise as desired. On the other hand, holes which are fired after being created by punching have stable side walls to which metallic deposits may be strongly adhered.

When the via holes are produced in the final fired ceramic substrate, generally by laser action, the side walls of the via holes may be structurally weak. Any metals coated onto such side walls cannot adhere with any strength greater than the coherent strength of the side walls, themselves.

In accordance with this invention, it is preferable, when the via holes have been produced in the hard, fired ceramic, to preheat the substrate before the electroless metal deposition step, to a temperature high enough to produce incipient fusion on the walls of the via holes. When the substrate is alumina, the temperature is from about $1200°$ C. and $1550°$ C. and preferably from about $1400°$ C. to about $1450°$ C. Preferably the temperature is raised to the incipient fusion level over a period of from about 4 to about 40 hours, held at the incipient fusion level for a period from about 1 to about 3 hours and then permitted to cool to ambient temperature over a period from about 4 to about 40 hours.

Copper and alumina have different coefficients of thermal expansion; and it might be expected that there would be a tendency for the materials to separate after repeated thermal cycles at least to the extent which would impair hermeticity. It has been found, however, that when the walls of the via holes are sufficiently close, the total expansion difference between the two materials is not so great as to produce forces sufficient to overcome the strong adhesive forces generated by the process of this invention. For via holes of circular cross section, adequate adhesion is obtained when the circle diameters are in the range from about 3 mils to about 50 mils. When the via holes are elongated in transverse cross-section, the adhesion along the elongated surfaces is sufficient to overcome the forces generated by the expansion difference even in the long direction, provided that the short dimension is in the range from about 3 mils to about 50 mils.

DESCRIPTION OF THE PREFERRED EMBODIMENTS

Figure 1:
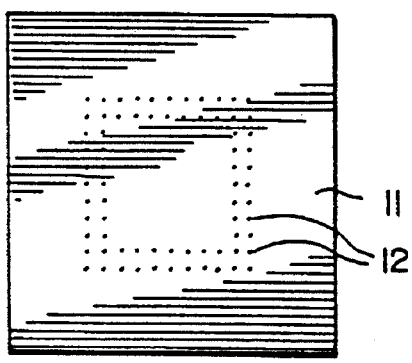
FIG. 1 is a plan view of a substrate in accordance with the invention in a typical embodiment in which the via holes are circular in cross-section parallel to the major surfaces of the substrate.

In the description hereinbelow, the successive steps in the process of the invention are shown in successive FIGS. 3–9 in which similar elements are designated by the same reference numerals.

A typical ceramic substrate in accordance with this invention is shown in plan view in FIG. 1. In FIG. 1, ceramic body 11 is made of a dielectric, insulating tough material, such as alumina, beryllia or aluminum nitride. It is thin, as compared to its length and breadth, typically from about 5 to about 100 mils thick and preferably from about 10 to about 40 mils thick. It contains a plurality of filled via holes 12 such as those shown in FIGS. 8 or 9, each of which is circular in transverse cross-section.

In FIG. 1, there are 72 filled via holes arranged in a pattern of two concentric squares. The precise arrangement of the filled via holes in any particular substrate is dependent on the circuitry in the device it is intended to serve.

Figure 2:
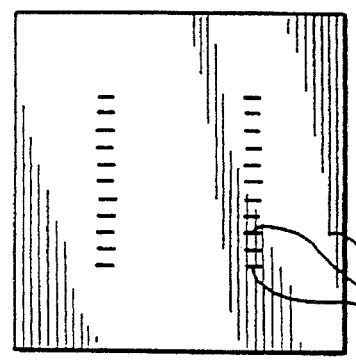
FIG. 2 is a plan view similar to that of FIG. 1 but where the via holes are elongated in cross-section parallel to the major surfaces of the substrate.

FIG. 2 is generally similar to FIG. 1, except that the via holes are elongated in transverse cross-section, rather than circular. Such elongated via holes are particularly useful for thermal transfer. FIG. 2 shows the elongated via holes to be elongated linearly. It is to be understood, however, that the via holes may be elongated arcuately, or zigzaggedly or in any other shape as long as the width of the via holes (the distance between opposite walls) is between about 3 mils and about 50 mils.

Figure 3:
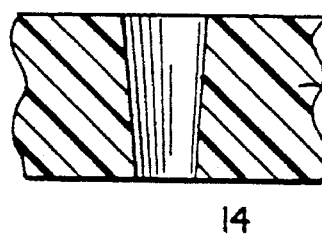
FIG. 3 is a fragmentary enlarged cross-section of a single via hole in a substrate prior to any metallization thereof.

FIG. 3 shows, in cross-section, a single via hole of circular cross-section in a ceramic substrate prior to any metallization thereof. In FIG. 3, hole 14 is shown within ceramic body 11. As shown, hole 14 is typical of a laser-fabricated via hole in that it has a somewhat larger diameter at one surface (the upper surface in the Figure). This is the direction from which the laser device has been applied.

The walls of hole 14 are shown in FIG. 3 to be smooth; and, macroscopically, they are smooth. However, the walls of laser-fabricated holes, may be seen, microscopically, to be fragmented and weak. As disclosed above, the ceramic substrate when laser-fabricated, is preferably subjected to a firing step to the temperature of incipient fusion, which firing leaves it unchanged in general appearance from what is shown in FIG. 3, but more receptive to adherent metal coating thereon by electroless deposition.

Figure 4:
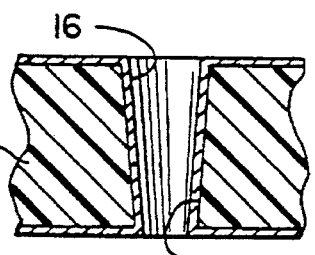
FIG. 4 is a fragmentary enlarged cross-section similar to FIG. 3 but after a thin metal deposition step.

FIG. 4 shows, in cross-section, the same ceramic substrate and same via hole as in FIG. 3, but after the deposition of a thin layer of metal 16. The thickness of layer 16 in FIG. 4 and in subsequent FIGS. 5–9 is not to scale and is actually very thin, typically only about 0.02 to about 0.05 mils in thickness.

The thin layer deposition may be by any method known in the art for such deposition, including vapor deposition. However, the preferred method is by electroless deposition.

Electroless metal deposition processes, including pre-cleaning steps and surface activation steps, are known in the art. Typical methods are disclosed in U.S. Pat. Nos. 3,993,799; 4,087,586; 4,220,678; 4,136,216; 4,199,623; 4,259,113; 3,958,048 and 5,058,799. The metal deposited by the electroless process is generally copper, sometimes deposited over an extremely thin activation layer of palladium. However, the electroless deposit may constitute metals other than copper, such as cobalt, iron, nickel, gold, silver and manganese.

Figure 5:
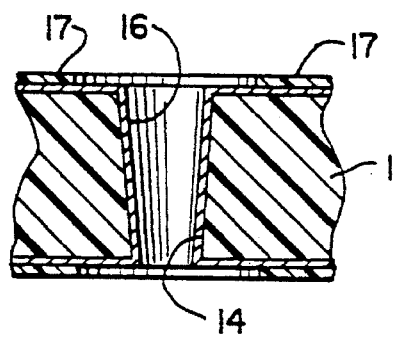
FIG. 5 is a fragmentary enlarged cross-sectional view similar to FIG. 4 but after the deposition of a resist layer in areas not close to the via holes.

FIG. 5 is similar to FIG. 4, except that it shows the deposit of a resist layer 17 in a pattern which covers the major surfaces of the substrate except for small areas around each via hole. The resist layer is very thin and is not shown to scale in FIGS. 5 and 6. The resist layer is initially deposited over the entire surface of the substrate and contains a photosensitive material. The surface is then shaded in a pattern to cover the area around each via hole, exposed to light to cross-link the exposed portions and then subjected to a solvent to remove the unexposed resist material around each via hole.

Figure 6:
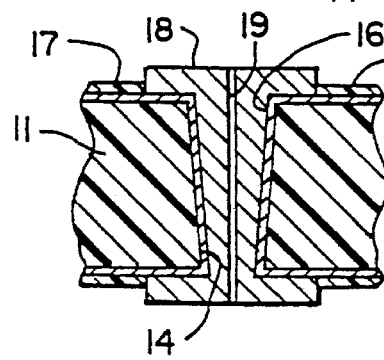
FIG. 6 is a fragmentary enlarged cross-sectional view similar to FIG. 5 but after the electrolytic deposition of a relatively thick layer of copper in areas not covered by a resist layer.

FIG. 6 is similar to FIG. 5, except that it shows an electrolytic deposit 18 of copper, or other highly conductive metal onto the electroless deposit in the areas not covered by the resist material 17, namely onto the walls of the via hole and onto the major surfaces of the substrate adjacent each end of the via hole. When electrolytic deposition is carried out as far as it will go, each via hole will be substantially filled with electrolytically deposited copper, except that a small hole 19 will remain because electrolytic deposition ceases when fresh electrolyte can no longer flow to the cathode. Hole 19 is actually smaller than shown in FIGS. 6 and 7 when the electrolytic deposit proceeds as far as it can; and in those cases, hole 19 is microscopic in diameter.

The electrolytic deposition need not proceed, however, until its natural cessation. It may be stopped at any time after at least about 5 volume percent of the via hole is filled with electrolytically deposited copper. Preferably at least 50 volume percent of the hole is filled.

The electrolytically deposited copper in and around each via hole is essentially dumbbell-shaped with the copper within the via hole constituting a connecting center portion and the copper deposited beyond the major surfaces of the substrate constituting the dumbbell ends. Preferably, the combined volume of the ends is from about 100% to about 400% of the volume of the center portion, with larger end volumes being associated with less metal filling in the via holes.

Figure 7:
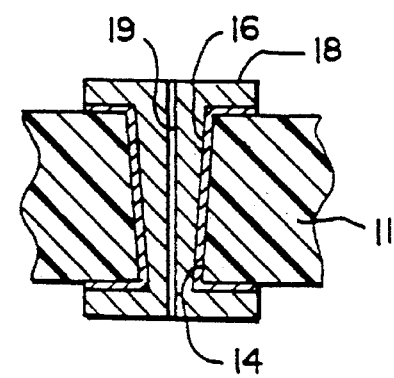
FIG. 7 is a fragmentary enlarged cross-sectional view similar to claim 6 but after removal of the resist layer and the electroless metal layer thereunder.

FIG. 7 is generally similar to FIG. 6, except that the substrate has been treated to remove the resist layer and the electroless deposited layer from those areas which are not protected by the electrolytically deposited copper.

Figure 8:
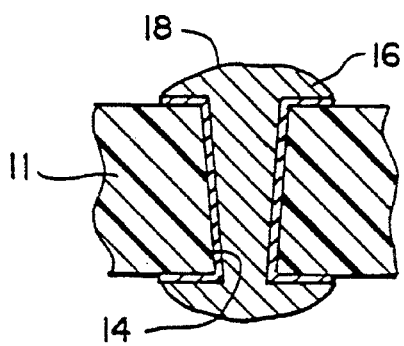
FIG. 8 is a fragmentary enlarged cross-sectional view similar to FIG. 7 but after the substrate has been heated to a temperature high enough to melt the electrolytically deposited copper.

FIG. 8 is similar to FIG. 7, except that it shows the substrate after it has been heated to above the melting point of copper, permitting molten copper to flow into and fill hole 19 by capillarity and/or gravity and thereby close the hole. FIG. 8 shows a convexity at each end of the dumbbell-shaped plug by reason of melting the copper therefrom. In some cases, the convex dumbbell ends may be substantially unequal, indicating that most, or even all, of the metal flow into the via hole may be from only one end of the dumbbell. It is believed that small temperature differences within the heating oven may cause one end of the dumbbell to reach the melting point of the copper before the other and may therefore cause most of the copper to flow from the hotter end.

The shape of the ends of the via plug after the melting step may vary from what is shown in FIG. 8. For example, one side may be concave, rather than convex by reason of capillary action. However, the plug is dumbbell-shaped in the sense that each of the two ends is wider in cross-section than the connecting portion within the via hole.

When the via hole is in the state shown in FIG. 8, it is generally hermetically sealed to the extent that when the substrate is in position, closing an electronic package, helium gas at ambient temperature and at a pressure differential of one atmosphere does not pass therethrough into the package at a rate as high as 1×10⁻⁹ cc/sec. after the substrate has been subjected to 250 heat/cool cycles between −50° C. to 150° C.

Figure 9:
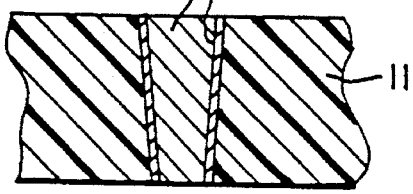
FIG. 9 is a fragmentary enlarged cross-sectional view similar to FIG. 8 but after lapping to remove deposited copper extending beyond the surfaces of the substrate.

For many purposes, the substrate, as shown in FIG. 8 may be the final product with electrical and/or thermal connections being made to the dumbbell ends of the plug. For some purposes, it may be necessary, or desirable, to remove the dumbbell ends by lapping and leave the via hole filling flush with the major surfaces of the substrate, as shown in FIG. 9.

Where hermetic sealing is essential, the lapped product of FIG. 9 may not be as reliable as the unlapped product of FIG. 8. Any lapped product which does not pass the helium hermeticity test may, of course, be used for any purpose which does not require hermeticity. However, if hermeticity is essential, the lapped product of FIG. 9 may be reworked through the series of steps described above in connection with FIGS. 4 to 8, and then subjected to a final lapping step, as shown in FIG. 9.

Figure 10:
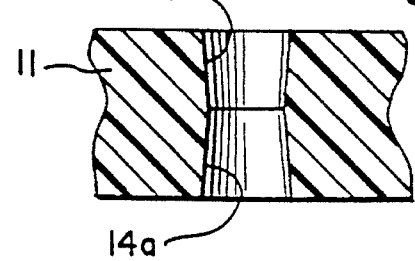
FIG. 10 is a fragmentary enlarged cross-sectional via hole similar to FIG. 3 except that the diameter of the hole is larger at transverse cross-sections at each surface than at a cross-section within the interior of the via hole.

FIG. 10 is similar to FIG. 3 in that it shows a substrate prior to any metal deposition thereon. It differs from FIG. 3 in that the via hole is wider at each end than at a center portion at a level between the two major surfaces of the substrate. Such via holes may be obtained by applying laser heating at each hole from both major surfaces, either simultaneously or successively. The narrower waist in each filled via hole provides a mechanical lock helping to anchor each plug in place.

Figure 11:
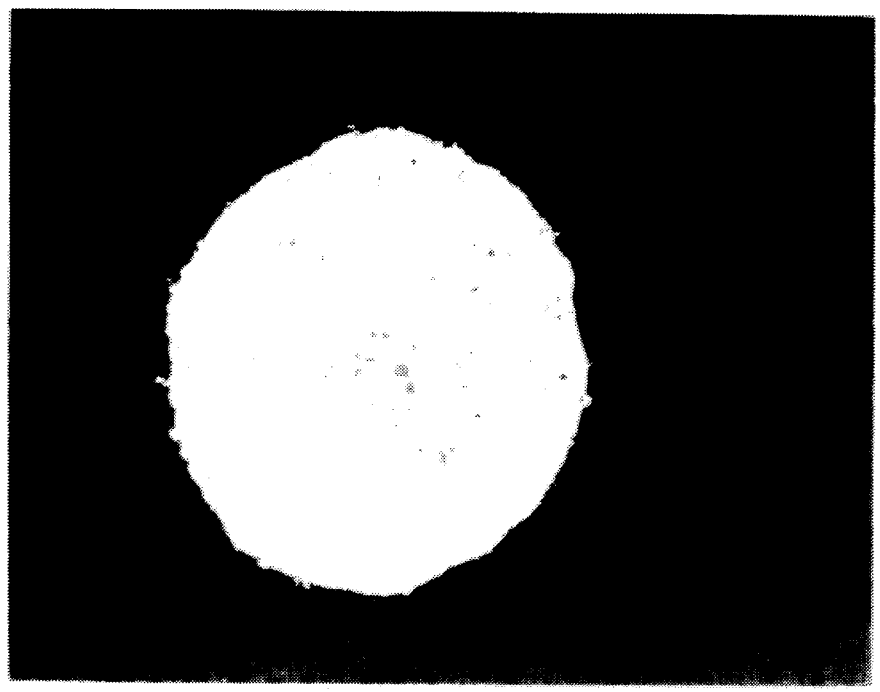
FIG. 11 is a photomicrograph at 200× enlargement of a transfer section of a filled via hole in an alumina substrate where copper is the sole filling material first by electroless coating, then by electrodeposition and finally by melting.

FIG. 11 is a photomicrograph of a transverse section of a circular via hole at 200× enlargement. In FIG. 11, the dark outer portion of the photomicrograph is the alumina substrate and the light-colored circular portion is an all-copper filling (copper having been used as both the thin metal coating of FIG. 4 and the electrodeposited layer of FIG. 6). The section was made after the substrate had been subjected to 1200 thermal cycles between −50° C. and 150° C. The dark areas within the copper filling are not voids but localized areas of copper oxide; and the diagonal line at about 9 o'clock is a polishing artifact.

Figure 12:
FIG. 12 is a photomicrograph similar to that of FIG. 11, except that it is at 1000× enlargement.

FIG. 12 is a photomicrograph similar to that of FIG. 11, except that it is at 1000× enlargement and shows only a portion of the circumference of the plug. As in FIG. 11, the dark areas within the copper filling are not voids, but copper oxide. There are actually no visible voids in the copper filling at 1000× enlargement.

FIG. 12 shows that the copper extends to the filling-alumina interface and actually infiltrates the alumina wall at microscopic fissures therein.

While the invention has been described with respect to the preferred embodiments, it will be understood by those skilled in the art that other modifications and embodiments fall within the purview of this invention.

What is claimed:

1. The process of providing electrical or thermal feedthrough to or from a thin ceramic plate which comprises producing in said plate a plurality of via holes, each having at least one transverse dimension from about 3 mils to about 50 mils, applying to the entire surface of said substrate a thin coating of a conductive metal, applying a resist coating to each of the major surfaces of said plate except at a small area around each entry of each via hole, electrodepositing a conductive metal of the group consisting of copper, silver, gold and alloys thereof onto said plate to the extent that each of said via holes is partially, but not completely filled with said metal and to the extent there is a deposit of said metal in each of said small areas which is thick enough to fill at least 5% of the volume of said via hole, removing said resist coating and said thin coating where it is exposed and thereafter heating said ceramic plate to a temperature at least as high as the melting point of said metal whereby metal from at least one of said small areas at each entry of each via hole is drawn into said via hole to complete the filling thereof.

2. The process of claim 1 wherein said electrodeposited metal is thick enough to fill at least 50% of the volume of said via hole.

3. The process of claim 1 wherein said thin coating of conductive metal is applied by electroless deposition.

4. The process of claim 1 wherein said metal is copper and said plate comprises alumina.

5. The process of claim 1 wherein said metal is copper and said plate comprises beryllia.

6. The method of claim 1 wherein said metal is copper and said plate comprises aluminum nitride.

7. The process of claim 1 wherein said via holes are produced by punching holes through a ceramic plate precursor in green sheet form and thereafter firing said precursor to produce a hard and tough ceramic plate.

8. The process of claim 1 wherein said via holes are produced by laser action on a hard and tough ceramic plate and said plate is thereafter heated, prior to said electroless coating step to a temperature which produces incipient fusion at the walls of said via holes.

9. The process of claim 8 wherein said plate comprises alumina and said incipient fusion heating step is to a temperature from about 1400° C. to about 1450° C.

* * * * *